(12) United States Patent
Watanabe (10) Patent No.: US 7,965,482 B2
(45) Date of Patent: Jun. 21, 2011

(54) ESD PROTECTION CIRCUIT AND SEMICONDUCTOR DEVICE

(75) Inventor: Kentaro Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 12/246,243

(22) Filed: Oct. 6, 2008

(65) Prior Publication Data
US 2009/0097176 A1 Apr. 16, 2009

(30) Foreign Application Priority Data

Oct. 10, 2007 (JP) ................ 2007-264860
Jul. 11, 2008 (JP) ................ 2008-181480

(51) Int. Cl.
*H02H 3/22* (2006.01)
(52) U.S. Cl. .......................... 361/56; 361/111
(58) Field of Classification Search ............. 361/56, 361/111
See application file for complete search history.

(56) References Cited

U.S. PATENT DOCUMENTS

| 5,852,541 | A | * | 12/1998 | Lin et al. ................ 361/111 |
| 7,085,113 | B2 | | 8/2006 | Gauthier et al. |
| 7,295,411 | B2 | | 11/2007 | Arai et al. |
| 7,339,770 | B2 | * | 3/2008 | Maloney et al. ........... 361/56 |
| 7,385,383 | B2 | * | 6/2008 | Reddy et al. ............. 324/76.11 |

FOREIGN PATENT DOCUMENTS

JP 11-017117 1/1999

* cited by examiner

*Primary Examiner* — Danny Nguyen
(74) *Attorney, Agent, or Firm* — Turocy & Watson, LLP (57) ABSTRACT

This disclosure concerns an ESD protection including logic gates connected between a first power input and a second power input, a second potential of the second power input lower than the first potential of the first power input, wherein in the logic gates, an output of the logic gate at a front stage are connected to an input of the logic gate at a rear stage, if a protection potential between the first and the second potentials is applied to a node connecting the output to the input when the logic gates respond to an ESD surge, a breakthrough current is carried to the logic gates from the first potential toward the second potential, and if the first and the second potentials are applied to the first power input and the second power input, logic values of the logic gates are kept in a constant state.

16 Claims, 9 Drawing Sheets

10··· EMICONDUCTOR DEVICE(LSI)
11··· INTERNAL CIRCUIT
12··· FIRST ESD PROTECTION CIRCUIT
13··· SECOND ESD PROTECTION CIRCUIT
14··· MOS TRANSISTOR
15··· FIRST EXTERNAL POWER-SUPPLY-INPUT TERMINAL
16··· SECOND EXTERNAL POWER-SUPPLY-INPUT TERMINAL
17··· INVERTER(LOGIC GATE CIRCUIT)

21··· P-MOS TRANSISTOR
22··· N-MOS TRANSISTOR
23··· FIRST POWER SUPPLY TERMINAL
24··· SECOND POWER SUPPLY TERMINAL
25··· INPUT TERMINAL
26··· OUTPUT TERMINAL

FIG. 2

31···VDD−VSS
32···Vin−VSS
33···Vout−VSS
34···CDM CURRENT

41··· N-MOS TRANSISTOR
42··· FIRST POWER SUPPLY TERMINAL
42··· SECOND POWER SUPPLY TERMINAL

FIG. 5

50··· FIRST ESD PROTECTION CIRCUIT
51~56···INVERTER

FIG. 6

60··· FIRST ESD PROTECTION CIRCUIT

70··· SEMICONDUCTOR DEVICE (LSI)
71··· FIRST ESD PROTECTION CIRCUIT
72··· SECOND CIRCUIT

81··· RESISTOR
82··· CAPACITOR
83··· INVERTER

FIG. 9

90··· THIRD CIRCUIT

FIG.10

FIG.11
FOURTH EMBODIMENT

ESD PROTECTION CIRCUIT AND SEMICONDUCTOR DEVICE

CROSS-REFERENCE TO RELATED APPLICATIONS

This application is based upon and claims the benefit of priority from the prior Japanese Patent Applications No. 2007-264860, filed on Oct. 10, 2007 and No. 2008-181480, filed on Jul. 11, 2008, the entire contents of which are incorporated herein by reference.

BACKGROUND OF THE INVENTION

1. Field of the Invention

The invention relates to an ESD protection circuit and a semiconductor device.

2. Related Art

A field effect transistor (hereinafter, "FET") in a semiconductor integrated circuit is scaled to follow the improved performance of the FET. In recent years, it is by no means unusual to reduce a thickness of a gate insulating film, converted into silicon dioxide, of the FET to about 1 nm.

If the thickness of the gate insulating film is smaller, withstand voltage against electrically dielectric breakdown greatly drops to depend on the thickness of the gate insulating film. In case of a semiconductor device including an FET that includes such a thin gate insulating film, if static electricity emanating from a machine or a human during manufacturing or during use is discharged into the semiconductor device, a high voltage is applied to the gate insulating film, often resulting in breakdown of the gate insulating film. Such a phenomenon is referred to as "ESD (Electrostatic Discharge) breakdown".

To prevent entry of surge current from outside, therefore, many semiconductor devices are designed to include ESD protection circuits to prevent ESD breakdown from occurring to gate insulating films (see for example, Japanese Patent Application Laid-open No. H11-17117 (hereinafter, "Patent Document 1")).

An ESD protection circuit disclosed in Patent Document 1 is configured as follows. An inverter interposes between an external GND terminal and a drain of an internal circuit to prevent the drain of the internal circuit from being directly connected to the external GND terminal. By so configuring, even if an input to a transfer gate of the internal circuit is to be set to GND level, current is prevented from flowing from a drain of a P-type transistor to VDD via a well and electrons are prevented from flowing from a drain of an N-type transistor to an external power supply potential VDD terminal.

However, the ESD protection circuit disclosed in the Patent Document 1 has the following problems. If surge is as fast as a CDM (Charged Device Model) that is one standard of the ESD, voltage overshoot occurs in an initial stage in which a protection element responds to the surge, resulting in the breakdown of the gate insulating film of the internal circuit.

The ESD breakdown resulting from the CDM is conspicuous particularly to a small-sized power supply circuit having a small-sized separate power supply.

SUMMARY OF THE INVENTION

An ESD protection circuit according to an embodiment of the present invention comprises a plurality of logic gates connected between a first power supply input to which a first potential is applied and a second power supply input to which a second potential lower than the first potential is applied, wherein in the plurality of logic gates, output terminals of each of the logic gates at a front stage is connected to an input terminal of each of the logic gate at a rear stage in rear of the front stage, if a protection potential between the first potential and the second potential is applied to a connection node connecting the output terminal to the input terminal when the plurality of logic gates respond to an ESD surge, a breakthrough current is carried to the plurality of logic gates from the first potential toward the second potential, and if the first potential and the second potential are applied to the first power supply input and the second power supply input, respectively, logic values of the plurality of logic gates are kept in a constant state.

DETAILED DESCRIPTION OF THE INVENTION

Embodiments of the present invention will be explained below in detail with reference to the accompanying drawings.

First Embodiment

Figure 1A:
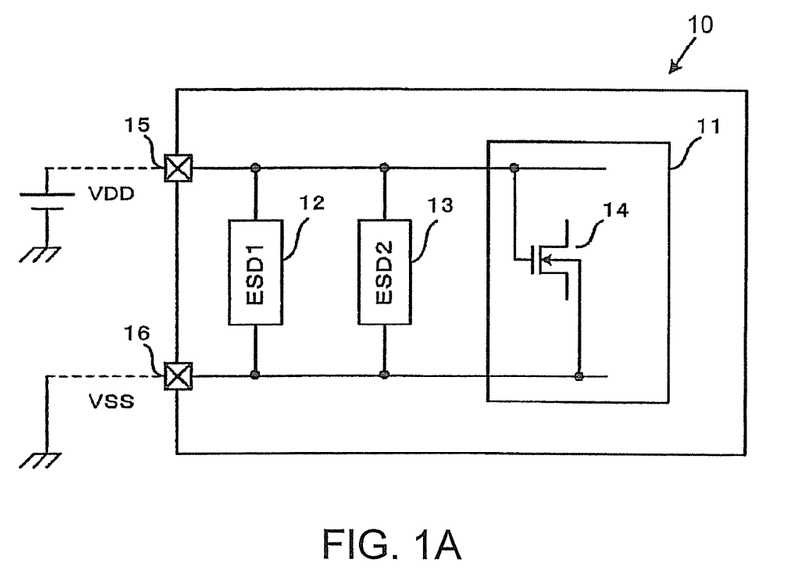
FIGS. 1A and 1B are circuit diagrams showing a semiconductor device using an ESP protection circuit according to a first embodiment of the present invention and the ESD protection circuit used in the semiconductor device, respectively.
Figure 1B:
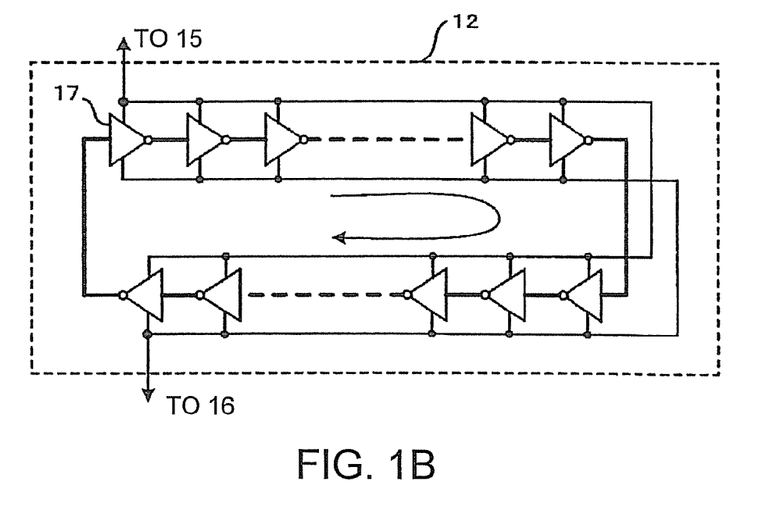

FIGS. 1A and 1B are circuit diagrams showing a semiconductor device using an ESP protection circuit according to a first embodiment of the present invention and the ESD protection circuit used in the semiconductor device, respectively. FIG. 1A is a circuit diagram showing the semiconductor device and FIG. 1B is a circuit diagram showing a first ESD protection circuit included in the semiconductor device shown in FIG. 1A.

As shown in FIG. 1A, a semiconductor device 10 according to the first embodiment, which is, for example, a logic LSI, includes an internal circuit 11 and a first ESD protection circuit 12 and a second ESD protection circuit 13 that protect the internal circuit 11 from surge.

The first ESD protection circuit 12 responds to fast surge such as the CDM (Charged Device Model) that is one model of the ESD and prevents breakdown of a gate insulating film of a MOS transistor 14 in the internal circuit 11.

The second ESD protection circuit 13 responds to slower surge than the CDM and prevents the breakdown of the gate insulating film of the MOS transistor 14 in the internal circuit 11. It suffices that the second ESD protection circuit 13 is lower in response speed than the first ESD protection circuit 12, so that an ordinary ESD protection circuit can be used as the second ESD protection circuit 13.

The internal circuit 11, the first ESD protection circuit 12, and the second ESD protection circuit 13 are connected to one another between a first external power-supply-input terminal 15 to which a first potential (VDD) is applied and a second external power-supply-input terminal 16 to which a second potential (VSS) (equal to a ground potential GND in first embodiment) lower than the first potential VDD.

As shown in FIG. 1B, the first ESD protection circuit 12 includes a plurality of inverters (logic gate circuits) 17 configured so that an output terminal of each of the inverters 17 at a front stage is connected to an input terminal of the each of the inverters 17 at a rear stage in rear of the front stage and so that the inverters 17 are connected to one another in a ring-shaped fashion.

That is, the first ESD protection circuit 12 is a ring of even-numbered inverters 17 and constitutes a closed loop. In the closed loop, the output terminal of each of the inverters 17 at the front stage is connected to the input terminal of each of the inverters 17 at the rear stage, an output terminal of the inverter 17 at a last stage is connected to an input terminal of the inverter 17 at a first stage, and an output from the inverter 17 at the last stage is fed back to an input to the inverter 17 at the first stage.

Figure 2:
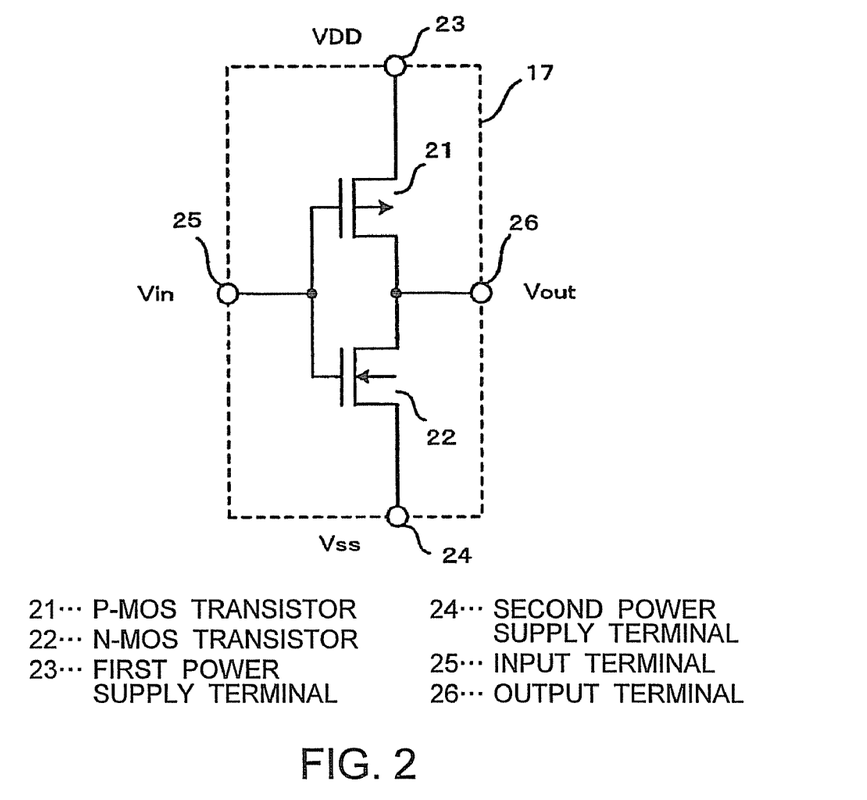
FIG. 2 is a circuit diagram showing a logic gate circuit of a first ESP protection circuit according to the first embodiment of the present invention.

FIG. 2 is a circuit diagram showing each of the inverters 17. As shown in FIG. 2, the inverter 17 is a CMOS inverter in which a P channel MOS transistor 21 and an N channel MOS transistor 22 are complementarily connected to each other.

A first power supply terminal 23 of the inverter 17 is connected to the first external power-supply-input terminal 15 and a second power supply terminal 23 thereof is connected to the second external power-supply-input terminal 16.

More specifically, the inverter 17 includes the P-type transistor 21 and the N-type transistor 22 connected in series between first external power-supply-input terminal 15 and the second external power-supply-input terminal 16. Gates of the P-type transistor 21 and the N-type transistor 22 are connected to an input terminal 25 in common. Drains of the P-type transistor 21 and the N-type transistor 22 are connected to an output terminal 26 in common. A source of the P-type transistor 21 is connected to the first power supply terminal 23 and a source of the N-type transistor 22 is connected to the second power supply terminal 24.

As well known, during a change in an input voltage Vin or an output voltage Vout to or from the CMOS inverter 17, that is, in an initial stage in which the CMOS inverter 17 responds, if an intermediate potential lower than the first potential VDD and higher than the second potential VSS is applied to the input voltage Vin, then both the PMOS transistor 21 and the NMOS transistor 22 often turn conductive and a breakthrough current flows from the first potential VDD toward the second potential VSS.

Figure 3:
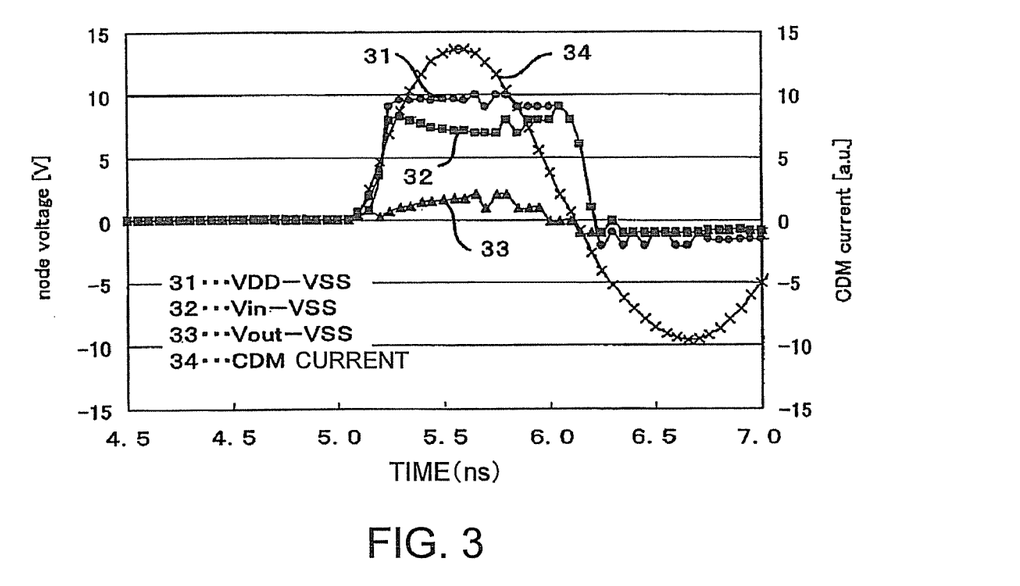
FIG. 3 is a timing chart showing an operation performed by the first ESD protection circuit according to the first embodiment of the present invention.

FIG. 3 is a timing chart showing an operation performed by the first ESD protection circuit 12. FIG. 3 shows a result of a simulation in which static electricity charged on a package of the semiconductor device 10 is discharged between the first and second external power-supply-input terminals 15 and 16 and CDM surge occurs while the first and second potentials VDD and VSS are not applied to the first and second external power supply terminals 15 and 16, respectively.

In FIG. 16, a solid curve 31 formed by black circular marks indicates a CDM surge voltage (VDD-VSS) (hereinafter, also "CDM surge voltage 31") applied to between the first and second external power-supply-input terminals 15 and 16 and a solid curve 32 formed by black rectangular marks indicates an input voltage (Vin-VSS) generated between the input terminal 25 of the inverter 17 and the second external power-supply-input terminal 16.

A solid curve 33 expressed by black triangular marks indicates an output voltage (Vout-VSS) generated between the output terminal 26 of the inverter 17 and the second external power-supply-input terminal 16. A solid curve 34 expressed by x marks indicates a CDM surge current (breakthrough current) (hereinafter, also "CDM surge current or breakthrough current 34") carried to the inverter 17.

As shown in FIG. 3, if fast CDM surge having rising time equal to or shorter than 1 ns occurs, then the input potential Vin and the output potential Vout of each inverter 17 included in the first ESD protection circuit 12 are not fixed in such short time, and the input terminal 25 and the output terminal 26 of the inverter 17 behave as floating nodes.

In these circumstances, the input voltage Vin and the output voltage Vout of the inverter 17 are set to be equal to the intermediate potential between the first potential VDD and the second potential VSS in a self-aligned fashion. As a result, the CDM surge current (breakthrough current) 34 is applied to the inverter 17.

More specifically, in an initial operation in which a plurality of inverters 17 reacts to the ESD surge, the protection potential applied to the input terminal 25 or the output terminal 26 is the potential between a potential higher than the second potential VSS by a threshold voltage of the N-type transistor 22 and a potential lower than the first potential VDD by an absolute value of a threshold voltage of the P-type transistor 21. As a result, both the P-type transistor 21 and the N-type transistor 22 of each of the inverters 17 are turned on.

It is assumed, for example, a voltage of 8 V is applied to the VDD as the surge voltage and the second potential VSS is 0 V. If the potential (Vin-VSS 32 shown in FIG. 3) of the input terminal 25 rises to 6 V, then a potential difference of −2 V is applied to between the source and the gate of the P-type transistor 21 and a potential difference of 6 V is applied to between the source and the gate of the N-type transistor 22. If the absolute value of the threshold voltage of the P-type transistor 21 is set to be lower than 2 V and that of the N-type transistor 22 is set to be lower than 6V, both the P-type transistor 21 and the N-type transistor 22 are turned on. As a result, the breakthrough current 34 is carried to the first-stage inverter 17.

At this time, the potential of the output terminal 26 of the first-stage inverter 17 is 2 V. The output terminal 26 of the first-stage inverter 17 is connected to the input terminal 25 of the second-stage inverter 17. Accordingly, a voltage of 2V is input to the input terminal 25 of the second-stage inverter 17. In this case, a potential difference of −6 V is applied to between the source and the gate of the P-type transistor 21 of the second-stage inverter 17 and a potential difference of 2 V is applied to be between the source and the gate of the N-type transistor 22 thereof. If the absolute value of the threshold voltage of the P-type transistor 21 is set to be lower than 6 V and that of the N-type transistor 22 is set to be lower than 2 V, both the P-type transistor 21 and the N-type transistor 22 of the second-stage inverter 17 are turned on. As a result, the breakthrough current 34 is also carried to the second-stage inverter 17.

At this time, the potential of the output terminal 26 of the second-stage inverter 17 is 6 V. Accordingly, the voltage of 6 V is applied to the input terminal 25 of the third-stage inverter 17. Therefore, the third-stage inverter 17 operates similarly to the first-stage inverter 17. The fourth-stage inverter 17 next to the third-stage inverter 17 operates similarly to the second-stage inverter 17. In this way, the inverters 17 to which the voltage of 6 V is input and which output the voltage of 2 V and the inverters 17 to which the voltage of 2 V is input and which output the voltage of 6 V are alternately connected.

To allow the two types of inverters 17 operating differently to have the same configuration, it is necessary to set the threshold voltage of the N-type transistor 22 of each inverter 17 to be lower than a minimum potential difference (lower than 2 V in the example described above) among the potential differences between the input terminals 25 of a plurality of inverters 17 and the second potential VSS. It is also necessary to set the absolute value of the threshold voltage of the P-type transistor 21 of each inverter to be lower than a minimum potential difference (lower than 2 V in the example described above) among the potential differences between the first potential VDD and the input terminals 25 of a plurality of inverters 17 when the inverters 17 respond to the ESD surge. By so setting, all the inverters having the same configuration are turned on at the time of the response to the ESD surge and the breakthrough current 34 can be carried to all the inverters 17.

Accordingly, the first ESD protection circuit 12 operates to discharge the CDM surge and acts to keep the potential difference between the first external power-supply-input terminal 15 and the second external reference potential terminal 16 to fall within a certain value.

As a consequence, the overshoot of the CDM surge voltage 31 is suppressed to make it possible to protect the gate insulating film of the MOS transistor 14 in the internal circuit 11 from the ESD breakdown.

Figure 4A:
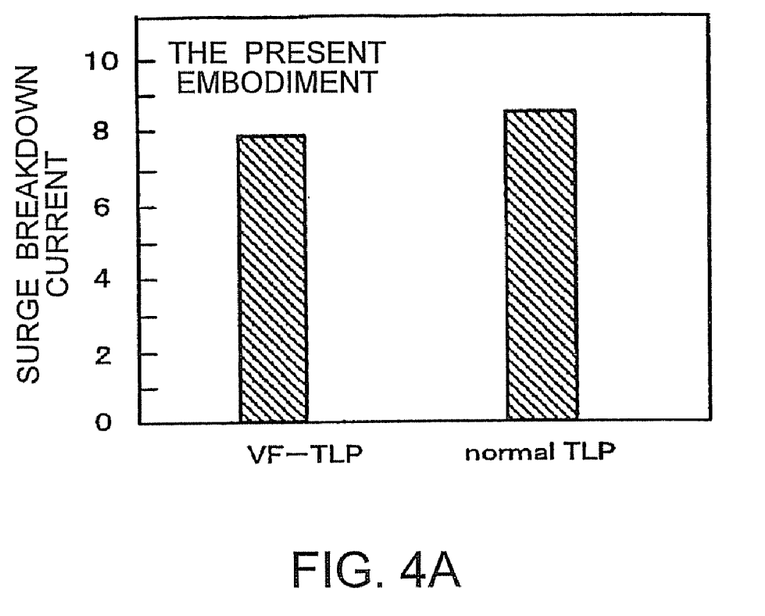
FIGS. 4A and 4B are charts showing results of a surge withstand test conducted to the semiconductor device 10 according to the first embodiment and to a comparison target, respectively.
Figure 4B:
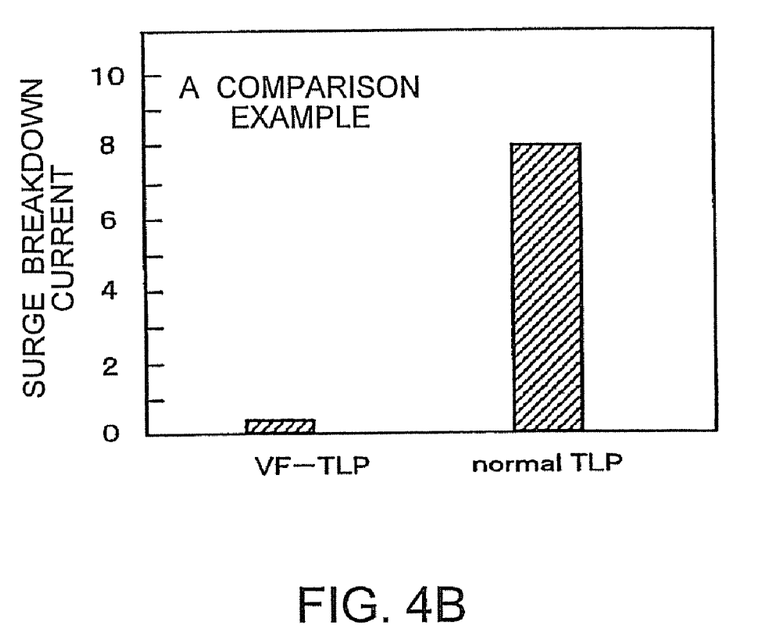

FIGS. 4A and 4B are charts showing results of a surge withstand test conducted to the semiconductor device 10 according to the first embodiment and to a comparison target, respectively. FIG. 4A shows the result with respect to the first embodiment and FIG. 4B shows the result with respect to the comparison example. The comparison target in the comparison example means a semiconductor device that does not include the first ESD protection circuit 12.

The surge withstand test was conducted using a VF-TLP (Very Fast Transmission Line Pulse) device capable of applying a pulse current simulating the surge current to a DUT (Device Under Test).

For comparison, a test result using a normal TLP longer in current pulse rising time than the VF-TLP device is shown. The comparison example will first be described.

As shown in FIG. 4B, in the comparison example, a surge current in the VL-TLP test is completely low or about 1 ampere (A).

The reason is as follows. A response speed of the second ESD protection circuit 13 for responding to the ESD surge is lower than a CDM surge rising speed. Due to this, before the second ESD protection circuit 13 operates, a potential of a pad of the first external power-supply-input terminal 15 is raised to be equal to or higher than a withstand voltage of the gate insulating film of the MOS transistor 14 of the internal circuit 11 by a CDM surge-caused overcurrent. As a result, the gate insulating film of the MOS transistor 14 of the internal circuit 11 is destroyed by an initial voltage overshoot.

On the other hand, a surge breakdown current in the normal TLP test is as high as about 8 A. This is because the second ESD protection circuit 13 that is the conventional ESD protection circuit has a sufficiently high response speed of responding to the ESD surge lower in speed than the CDM surge.

As shown in FIG. 4A, according to the first embodiment, a surge breakdown current in the VL-TLP test is as high as about 8 A.

The reason is as follows. The response speed of the first ESD protection circuit 12 for responding to the ESD surge is sufficiently high as compared with the CDM surge rising speed. Due to this, no initial voltage overshoot occurs.

According to the first embodiment, a surge breakdown current in the normal TLP test is also as high as about 8 A. This is because the second ESD protection circuit 13 that is the conventional ESD protection circuit satisfactorily functions.

Figure 5:
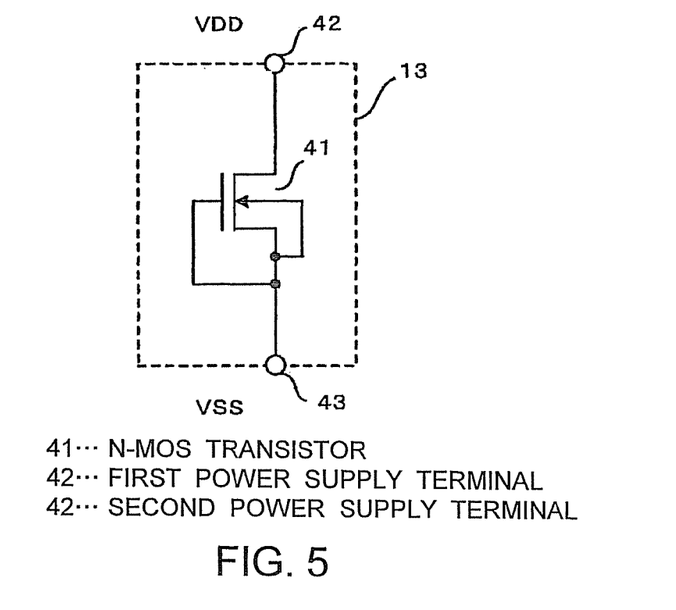
FIG. 5 is a circuit diagram showing a second ESD protection circuit.

FIG. 5 is a circuit diagram showing an example of the ordinary or second ESD protection circuit 13. FIG. 5 shows an example of a GG (Grounded Gate) MOS using an NPN bipolar transistor parasitic to the MOS transistor 41.

In a normal operation in which the first and second potentials VDD and VSS are applied to the first and second external power-supply-input terminals 15 and 16, respectively, the inverter ring at even-numbered stages of the first ESD protection circuit 12 does not perform a dynamic operation (ring oscillation). Due to this, potentials of connection nodes connecting the output terminals of inverters at front stages to the input terminals of inverters at rear stages are fixed to the first potential VDD or the second potential VSS.

As a result, the first ESD protection circuit 12 hardly consumes AC current or DC current and does not influence the normal operation of the semiconductor device 10.

Furthermore, the inverter ring at even-numbered stages is configured so that the input terminal of the inverters 17 constituting the ring are connected to the output terminal of the inverters 17 at the front stages, respectively. All the input terminals are coupled to the first potential VDD or the second potential VSS via the MOS transistors 21 and 22.

Due to this, as compared with direct connection of the input terminals to the first potential VDD or the second potential VSS, the input terminals can easily behave as floating nodes at the initial stage of the ESD surge.

The number of stages of the inverters 17 of the first ESD protection circuit 12 is not limited to a specific number. If the number of stages of the inverters 17 is greater, a surge current capacity becomes larger but an occupation area of the inverters 17 increases.

For this reason, the number of stages of the inverters 17 is preferably set according to a necessary surge current capacity. After various considerations, it is appropriate to set the number of stages of the inverter ring to four or more.

As described above, the first ESD protection circuit 12 according to the first embodiment is configured to include a plurality of inverter 17 connected between the first external power-supply-input terminal 15 to which the first potential VDD is applied and the second external power-supply-input terminal 16 to which the second potential VSS lower than the first potential VDD is applied, having the output terminals 26 of the inverters 17 at front stages connected to the input terminals 25 of the inverters 17 at rear stage, respectively, and connected to one another ring-shaped fashion.

By so configuring, if the intermediate potential lower than the first potential VDD and higher than the second potential VSS is applied to the connection nodes connecting the output terminals 26 of the inverters 17 at front stages to the input terminals 25 of the inverters 17 at rear stages, respectively at the initial stage at which a plurality of inverters 17 respond to the ESD surge, the breakthrough current 34 is carried to the inverters 17 from the first potential VDD to the second potential VSS.

It is, therefore, possible to obtain the first ESD protection circuit 12 having fast response speed and the semiconductor device 10 using the first ESD protection circuit 12.

In the first embodiment, the example in which the logic gate circuits of the first ESD protection circuit 12 are CMOS inverter 17 has been described. However, other logic gate circuits can be used as the logic gate circuits as long as the breakthrough current can be carried to the logic gate circuits.

For example, even if logic gate circuits partially including a NAND gate circuit, a NOR gate circuit or the like are used, similar advantages to those of the first embodiment can be expected.

In the first embodiment, the example in which the first ESD protection circuit 12 includes the inverter ring at even-numbered stages has been described. The first ESD protection circuit 12 can include an inverter ring at odd-numbered stages.

Since the inverter ring at odd-numbered stages performs a dynamic operation (ring oscillation), unnecessary power is consumed. Nevertheless, the second ESD protection circuit 12 including the inverter ring at odd-numbered stages similarly functions as the ESD protection circuit against the ESD surge.

Second Embodiment

Figure 6:
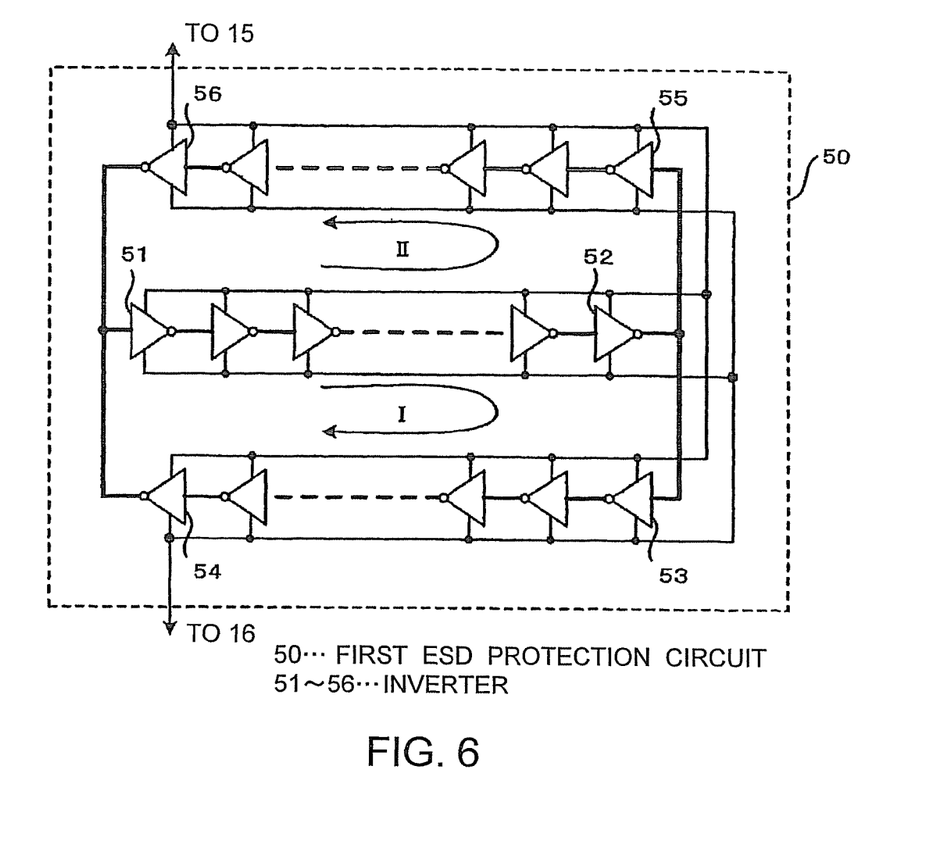
FIG. 6 is a circuit diagram showing a first ESD protection circuit according to a second embodiment of the present invention.

FIG. 6 is a circuit diagram showing a first ESD protection circuit 50 according to a second embodiment of the present invention. In the second embodiment, like constituent elements as those in the first embodiment are denoted by like reference symbols, respectively and will not be repeatedly described herein, and only elements different from those according to the first embodiment will be described.

The second embodiment differs from the first embodiment in that a plurality of inverters is connected in a double ring-shaped fashion so that partial inverters can be shared between two inverter rings.

That is, as shown in FIG. 6, the first ESD protection circuit 50 according to the second embodiment includes a first inverter ring I and a second inverter ring II. The first inverter ring I is configured so that inverters between inverters 51 and 52 are connected to inverters between inverters 53 and 54 in a ring-shaped fashion. The second inverter ring is configured so that the inverters between the inverters 51 and 52 are connected to inverters between inverters 535 and 56 in a ring-shaped fashion.

An output terminal of the inverter 52 branches off to be connected to input terminals of both the inverters 53 and 55, and output terminals of the inverters 54 and 56 are connected to an input terminal of the inverter 51 in common. By doing so, the inverters between the inverters 51 and 52 are shared between the first and second inverter rings I and II.

As a logic gate circuit that replaces the inverter 51, a two-input NAND gate circuit, a two-input NOR gate circuit or the like can be appropriately used. If such a circuit is used in place of the inverter 51, one of two input terminals of the circuit is connected to the output terminal of the inverter 54 and the other input terminal thereof is connected to the output terminal of the inverter 56.

As described above, in the first ESD protection circuit 50 according to the second embodiment, a plurality of inverters is connected to one another in a double ring-shaped fashion to share partial inverters between the two inverter rings I and II. The second embodiment is suited for an example in which a NOT gate circuit, a NAND gate circuit, a NOR gate circuit or the like is included in logic gate circuits.

In the second embodiment, the example in which the inverters are connected in the double ring-shaped fashion so as to share partial inverters between the two inverter rings I and II has been described. Alternatively, the inverters can be connected in multiple (three or more) ring-shaped fashion so as to share partial inverters among multiple inverter rings.

Figure 7:
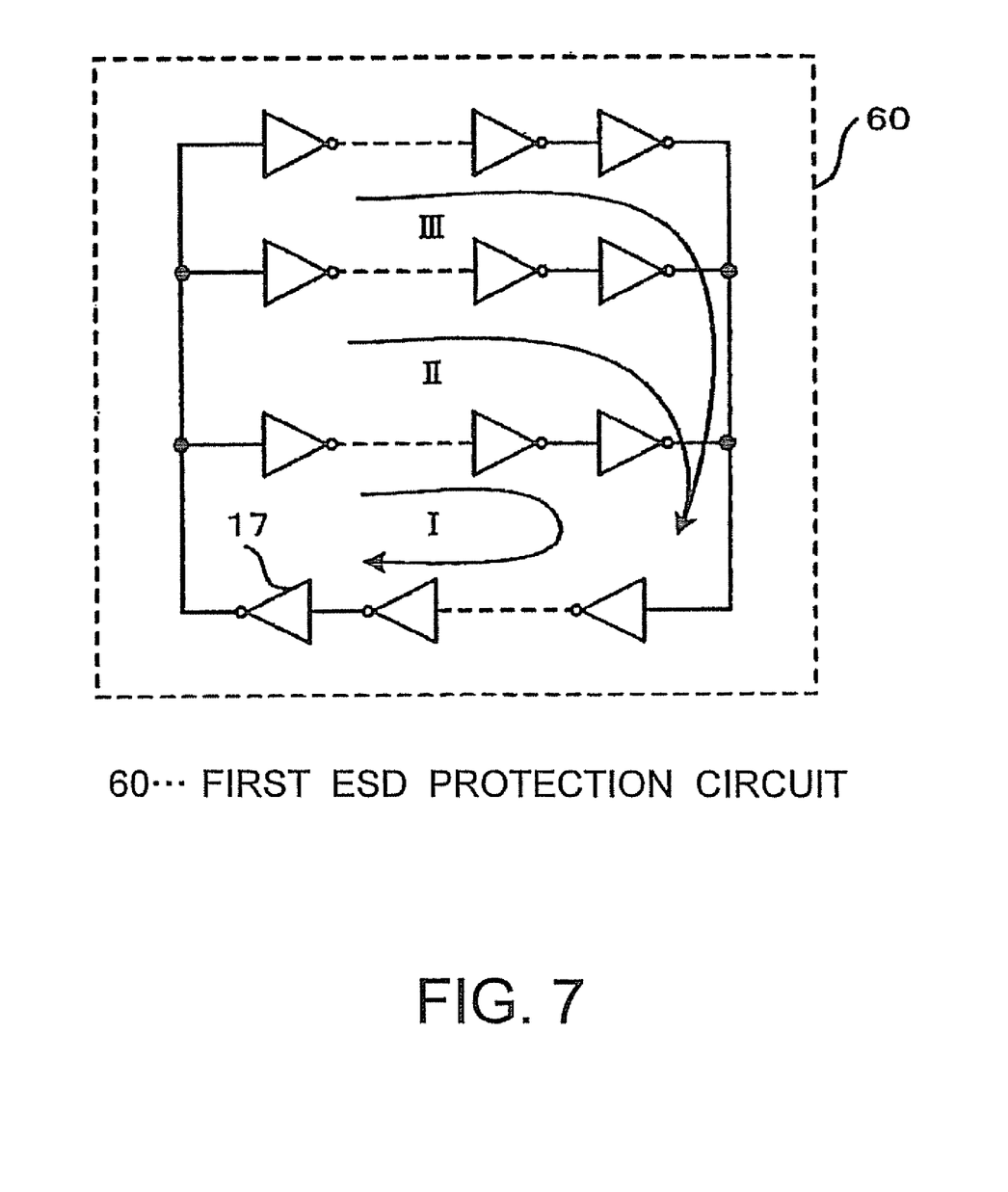
FIG. 7 is a circuit diagram showing another first ESD protection circuit according to the second embodiment of the present invention.

FIG. 7 is a circuit diagram showing a first ESD protection circuit 60 configured so that a plurality of inverters 17 is connected to one another in a three ring-shaped fashion to share partial inverters 17 among the three inverter rings.

Third Embodiment

Figure 8A:
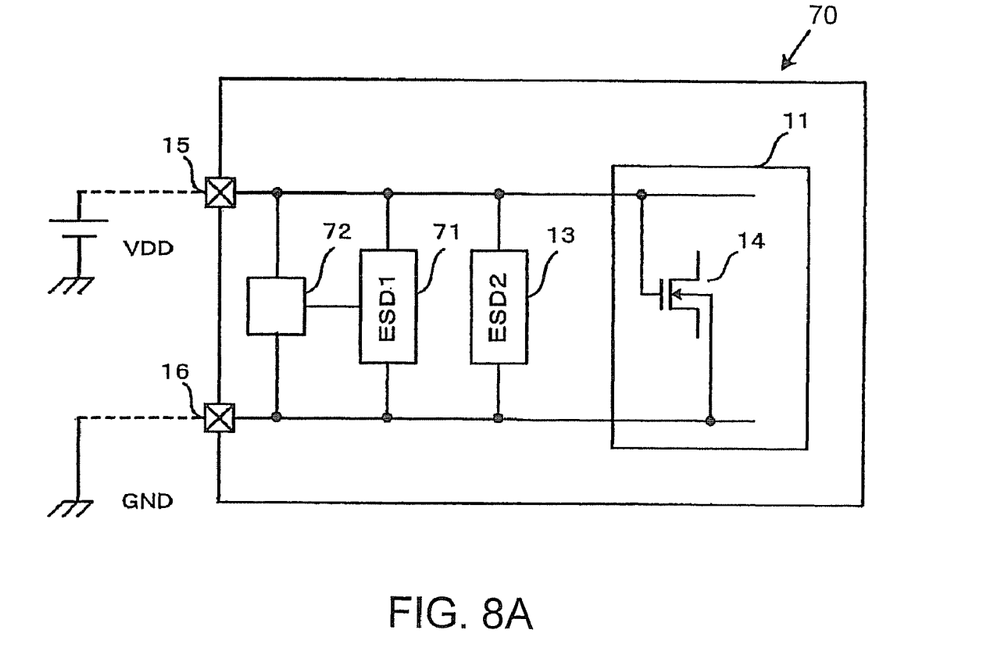
FIGS. 8A and 8B are circuit diagrams showing a semiconductor device using an ESP protection circuit according to a third embodiment of the present invention and the ESD protection circuit used in the semiconductor device, respectively.
Figure 8B:
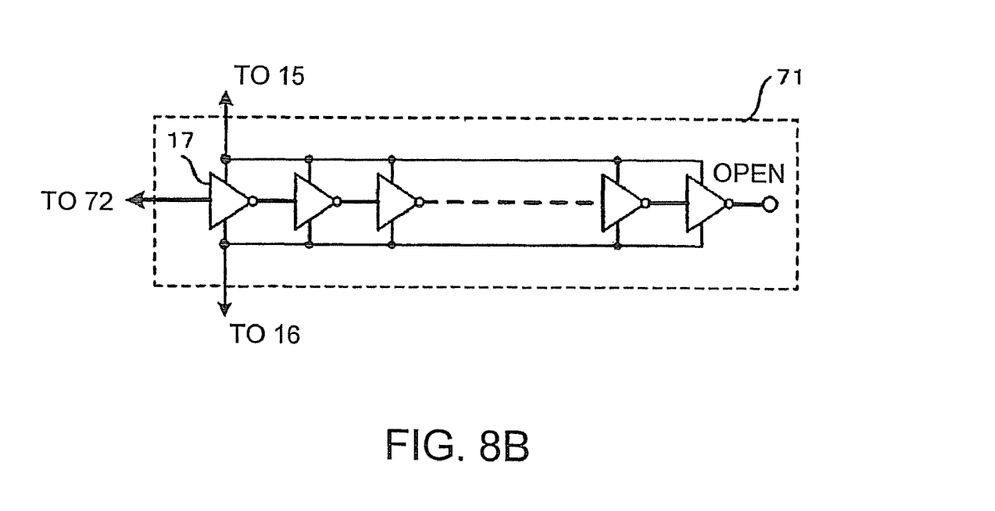

FIGS. 8A and 8B are circuit diagrams showing a semiconductor device using an ESP protection circuit according to a third embodiment of the present invention and the ESD protection circuit used in the semiconductor device, respectively. FIG. 8A is a circuit diagram showing the semiconductor device and FIG. 8B is a circuit diagram showing a first ESD protection circuit included in the semiconductor device shown in FIG. 8A.

In the third embodiment, like constituent elements as those in the first embodiment are denoted by like reference symbols, respectively and will not be repeatedly described herein, and only elements different from those according to the first embodiment will be described.

The third embodiment differs from the first embodiment in that a plurality of inverters is connected in a line-shaped fashion.

That is, as shown in FIGS. 8A and 8B, a semiconductor device 70 according to the third embodiment includes a first ESD protection circuit 71 and a second ESD protection circuit 72 connected to the first ESD protection circuit 71.

The first ESD protection circuit 71 includes a plurality of inverters 17 having output terminals of the inverters 17 at front stages connected to input terminals of the inverters 17 at rear stages, respectively and connected to one another in a line-shaped fashion.

An input terminal of the inverter 17 at a first stage is connected to an output terminal of a second circuit 72. An output terminal of the inverter 17 at a last stage is not connected to an input terminal of the inverter 17 at the first stage but is open.

The second circuit 72 is configured as follows. If the first and second potentials VDD and VSS are not applied to the first and second external power-supply-input terminals 15 and 16, respectively, an output terminal of the second circuit 72 is in a floating state. If the first and second potentials VDD and VSS are applied to the first and second external power-supply-input terminals 15 and 16, respectively, the second circuit 72 outputs a certain value.

It suffices that the second circuit 72 satisfies these conditions and, for example, an existing circuit in the semiconductor device 71 can be used as the second circuit 72.

Further, a power ON reset circuit used to generate a reset signal for ordinary flip-flops can be used as the second circuit 72.

Figure 9:
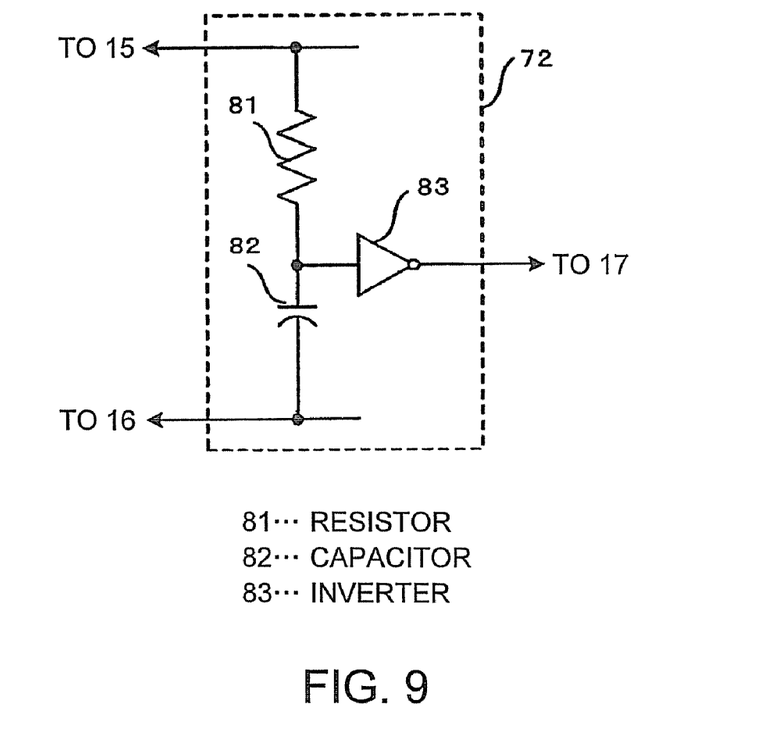
FIG. 9 is a circuit diagram showing a second circuit of a semiconductor device according to a third embodiment of the present invention.

FIG. 9 is a circuit diagram showing the power-ON reset circuit serving as the second circuit 72. As shown in FIG. 9, the power-ON reset circuit 72 includes a serial circuit having a resistor 81 and a capacitor 82 connected in series and an inverter 83 having an input terminal connected to a connection node connecting the resistor 81 to the capacitor 82.

If the first and second potentials VDD and VSS are not applied to the first and second external power-supply-input terminals 15 and 16, respectively, then a potential of the input terminal of the inverter 83 is undefined and an output terminal of the inverter 83 behaves as a floating node.

As a result, if the intermediate potential lower than the first potential VDD and higher than the second potential VSS is applied to connection nodes connecting the output terminals 26 of the inverters 17 at front stages to the input terminals 25 of the inverters 17 at rear stages, respectively, the breakthrough current is carried to a plurality of inverters 17 from the first potential VDD to the second potential VSS.

Therefore, the first ESD protection circuit 17 having fast response speed and the semiconductor device 71 using the first ESD protection circuit 17 can be obtained.

Meanwhile, if the first and second potentials VDD and VSS are applied to the first and second external power-supply-input terminals 15 and 16, respectively, then the capacitor 82 is charged through the resistor 81 and the potential of the input terminal of the inverter 83 rises.

If the potential of the input terminal of the inverter 83 is equal to the first potential VDD, the inverter 83 outputs "L" level (a constant value).

As a result, the potential of the input terminal 25 of the inverter 17 at the first stage is fixed to the "L" level in a normal operation, so that the first ESD protection circuit 71 does not perform a dynamic operation (ring oscillation). Therefore, potentials of the connection nodes connecting the output terminals 26 of the inverters 17 at front stages to the input terminals 25 of the inverters 17 at rear stages, respectively are fixed to the first potential VDD or the second potential VSS.

Accordingly, the first ESD protection circuit 71 hardly consumes AC current or DC current and does not influence the normal operation of the semiconductor device 70.

As described above, the first ESD protection circuit 71 according to the third embodiment includes a plurality of inverters 17 configured so that the output terminals of the inverters 17 at front stages are connected to the input terminals of the inverters 17 at rear stages, respectively, and so that the inverters 17 are connected to one another in a line-shaped fashion.

With this configuration, the first ESD protection circuit 71 has the following advantage. There is no need to provide a return wiring connecting the output terminal of the inverter 17 at the last stage to the input terminal of the inverter 17 at the first stage.

Figure 10:
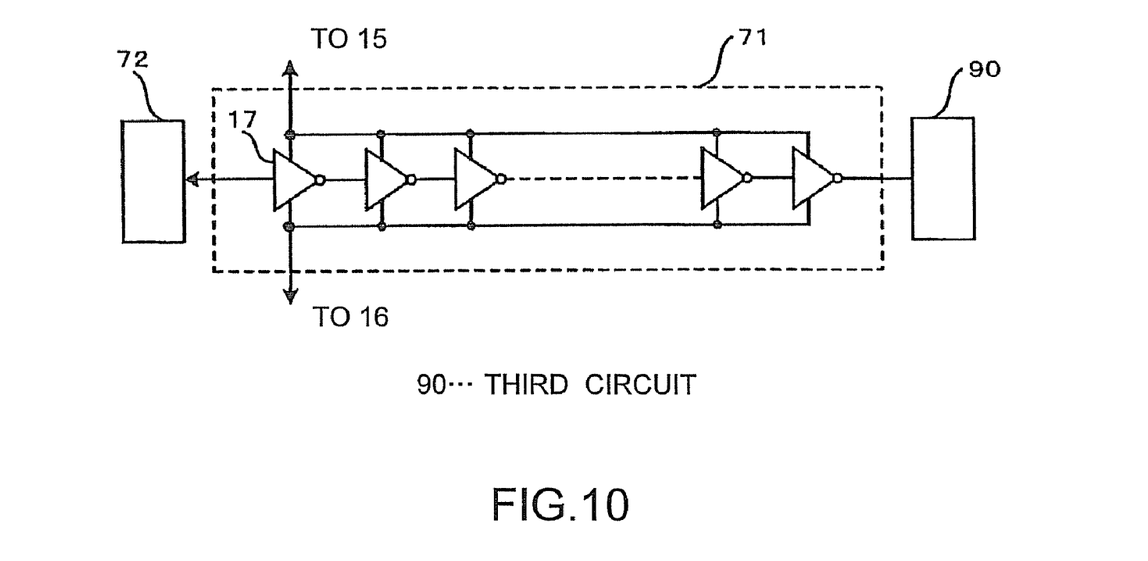
FIG. 10 is a circuit diagram showing another first ESD protection circuit according to the third embodiment of the present invention.

In the third embodiment, the example in which the output terminal of the inverter 17 at the last stage is open has been described. Alternatively, as shown in FIG. 10, the output terminal of the inverter 17 at the last stage can be connected to an arbitrary third circuit 90.

According to the present invention, configurations set forth in the following notes can be adopted.

(Note 1) The ESD protection circuit according to claim 1, wherein the plurality of logic gate circuits is connected in a multiple ring-shaped fashion to partially share the logic gate circuits among multiple rings.

(Note 2) An ESD protection circuit comprising: an internal circuit connected between a first external power-supply-input terminal to which a first potential is applied and a second external power-supply-input terminal to which a second potential lower than the first potential is applied; and a plurality of logic gate circuits connected between the first external power-supply-input terminal and the second external power-supply-input terminal, output terminals of the logic gate circuits at front stages being connected to input terminals of the logic gate circuits at rear stages, respectively, the logic gate circuits being connected in a line-shaped fashion, wherein if an intermediate potential lower than the first potential and higher than the second potential is applied to connection nodes connecting the output terminals to the input terminals, respectively in an initial stage in which the plurality of logic gate circuits responds to an ESD surge, a breakthrough current is carried to the plurality of logic gate circuits from the first potential to the second potential, and if the first potential and the second potential are applied to the first external power-supply-input terminal and the second external power-supply-input terminal, respectively, a logic value in a constant state is applied to the input terminal of the logic gate circuit at a first stage.

Fourth Embodiment

Figure 11:
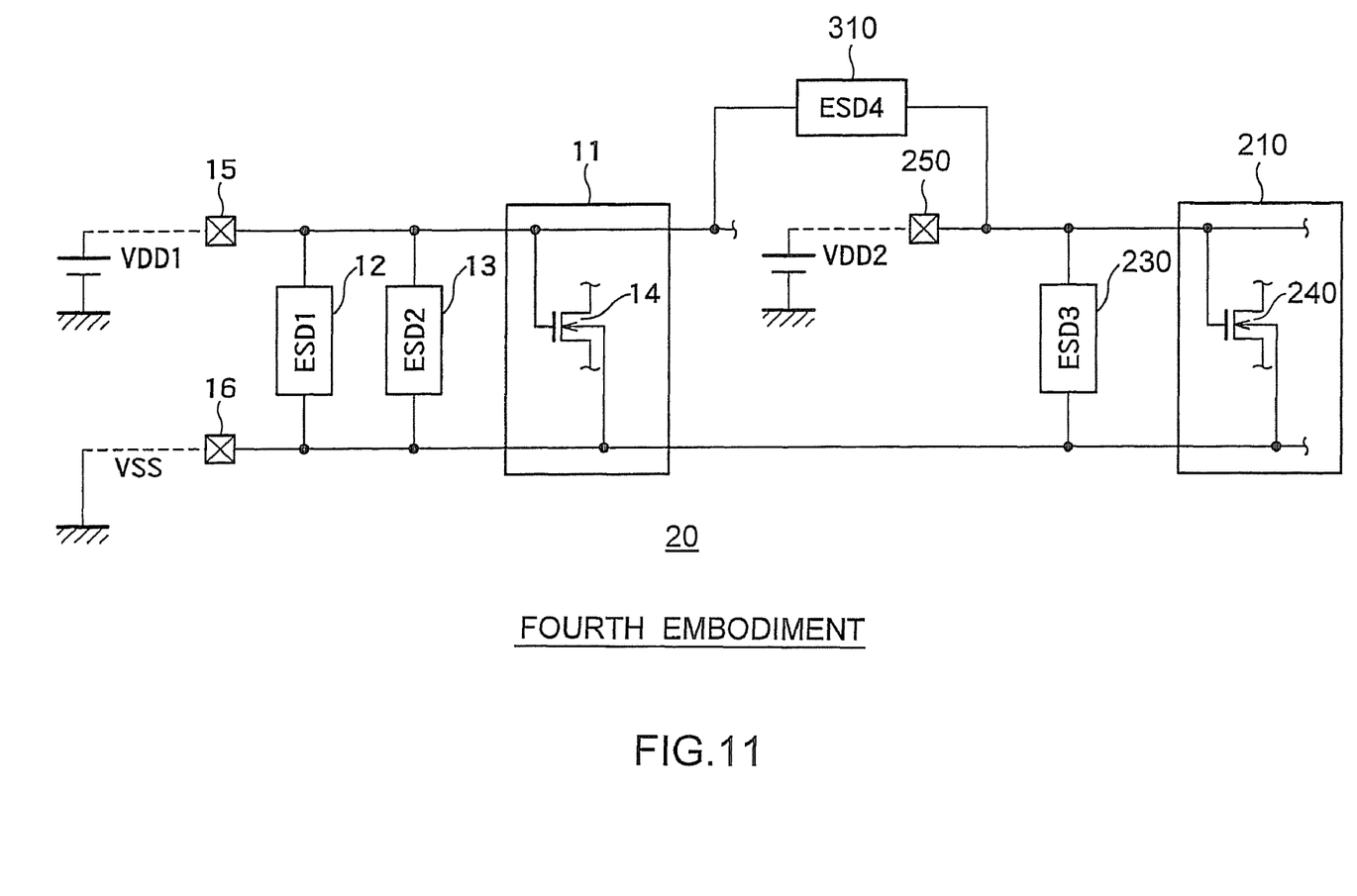
FIG. 11 is a configuration diagram of an ESD protection circuit and a semiconductor device using the ESD protection circuit according to a fourth embodiment of the present invention.

FIG. 11 is a configuration diagram of an ESD protection circuit and a semiconductor device using the ESD protection circuit according to a fourth embodiment of the present invention. A semiconductor device 20 according to the fourth embodiment includes a first external power-supply-input terminal 15 and a third external power-supply-input terminal 250 connected to a plurality of potentials VDD1 and VDD2 as well as a second external power-supply-input terminal 16 connected to a ground potential VSS. That is, the semiconductor device 20 according to the fourth embodiment includes a plurality of power supplies different in potential. The potential VDD2 is higher than the ground potential VSS and lower than the potential VDD1. In FIG. 11, only two type of power supply potentials VDD1 and VDD2 are shown. Alternatively, as described later, the semiconductor device 20 according to the fourth embodiment can have three or more power supply potentials.

In the fourth embodiment, configurations and connection relations of the internal circuit 11, the first ESD protection circuit 12, the second ESD protection circuit 13, the first external power-supply-input terminal 15, and the second external power-supply-input terminal 16 may be similar to those according to any one of the first to third embodiments.

The semiconductor device 20 according to the fourth embodiment further includes an internal circuit 210 connected between the second external power-supply-input terminal 16 and the third external power-supply-input terminal 250, a third ESD protection circuit 230 connected between the second external power-supply-input terminal 16 and the third external power-supply-input terminal 250, a surge transfer circuit 310 connected between the first external power-supply-input terminal 15 and the second external power-supply-input terminal 16, and the third external power-supply-input terminal 250.

The third ESD protection circuit 230 can be configured similarly to the second ESD protection circuit 13. That is, similarly to the second ESD protection circuit 13, the third ESD protection circuit 230 is an ESD protection circuit responding to slower ESD surge than the CDM and prevents breakdown of a gate insulating film of a MOS transistor 240 included in the internal circuit 210. It suffices that the third ESD protection circuit 230 is lower in response speed than the first ESD protection circuit 12 and the surge transfer circuit 310, so that an ordinary ESD protection circuit can be used as the third ESD protection circuit 230. A response speed of the third ESD protection circuit 230 can be set almost equal to that of the second ESD protection circuit 13.

A response speed of the surge transfer circuit 310 is almost equal to or higher than that of the first ESD protection circuit 12. The surge transfer circuit 310 is a circuit operating if the third external power-supply-input terminal 250 is higher in potential than the first external power-supply-input terminal 15.

The internal circuit 11 and 210 that are protection targets operate in response to the different power supply potentials VDD1 and VDD2, respectively. If a CDM surge is input to the first external power-supply-input terminal 15, the semiconductor device 20 according to the fourth embodiment operates similarly to the semiconductor device according to the second embodiment. Therefore, the operation performed by the semiconductor device 20 in this case will not be described.

Note that an ESD protection circuit corresponding to the first ESD protection circuit 12 is not provided between the third external power-supply-input terminal 250 and the second external power-supply-input terminal 16. That is, a protection circuit responding to a slow surge such as the CDM surge is not provided for the internal circuit 210. Therefore, if the CDM surge is input to the third external power-supply-input terminal 250, the semiconductor device 20 according to the fourth embodiment operates as follows.

If the CDM surge is input to the third external power-supply-input terminal 250, the third ESD protection circuit 230 does not operate in an initial stage. However, since the potential of the third external power-supply-input terminal 250 is far higher than that of the first external power-supply-input terminal 15, the surge transfer circuit 310 transfers a surge current from the third external power-supply-input terminal 250 to the first external power-supply-input terminal 15. By doing so, the surge current passes through the first ESD protection circuit 12 and flows to the second potential VSS. As a result, voltage overshoot can be suppressed between the power supply potential VDD2 and the reference potential VSS and the internal circuit 210 can be protected from the CDM surge.

The surge transfer circuit 310 together with the first ESD protection circuit 12 serves as a part of discharge path for suppressing the voltage overshoot of the power supply potential VDD2. Due to this, it is necessary that the surge transfer circuit 310 operates at higher speed than the second and third ESD protection circuits 13 and 230 in terms of the response speed of responding to the CDM surge, and that the surge transfer circuit 310 operate at the same speed or higher speed than the first ESD protection circuit 230 (Condition 1).

Moreover, the surge protection circuit 310 should not be conductive in the ordinary operation but operates only if the ESD surge occurs (Condition 2). That is, it is necessary that the surge transfer circuit 310 is conducive only if the ESD surge occurs and should not be conductive at a potential difference applied to between the first external power-supply-input terminal 15 and the third external power-supply-input terminal 250 in the ordinary operation.

FIGS. 12A to 12E are schematic diagrams showing specific examples of the surge transfer circuit 310 satisfying the Conditions 1 and 2.

Figure 12A:
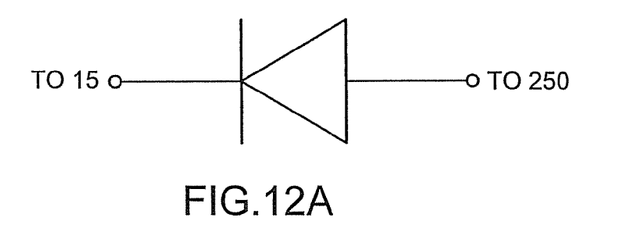
FIGS. 12A to 12E are schematic diagrams showing specific examples of the surge transfer circuit 31.

As shown in FIG. 12A, the surge transfer circuit 310 can be constituted by a single diode. An anode of the diode is connected to the third external power-supply-input terminal 250 and a cathode thereof is connected to the first external power-supply-input terminal 15. The single diode can operate at higher speed than inverters, a diode string, a thyristor or the like that possibly constitute the first ESD protection circuit 12. The single diode can, therefore, satisfy the Condition 1.

Furthermore, since the power supply potential VDD2 is lower than the power supply potential VDD1 in the normal operation, the surge transfer circuit 310 separates the first external power-supply-input terminal 15 from the third external power-supply-input terminal 250. If the CDM surge is input to the third external power-supply-input terminal 250, the potential of the third external power-supply-input terminal 250 overshoots the potential of the first external power supply potential 15 in short time. In this case, the surge transfer circuit 310 applies the surge current from the third external power-supply-input terminal 250 to the first external power-supply-input terminal 15. The single diode can, therefore, satisfy the Condition 2.

Figure 12B:
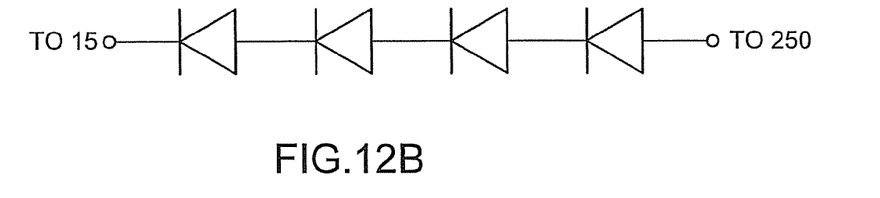

As shown in FIG. 12B, the surge transfer circuit 310 can be constituted by a diode string having a plurality of diodes connected in series. An anode of the diode string is connected to the third external power-supply-input terminal 250 and a cathode thereof is connected to the first external power-supply-input terminal 15.

By changing the number of stages of the diodes, the response speed of the surge transfer circuit 310 can be set equal to or lower than that of the first ESD protection circuit 12. For example, if the first ESD protection circuit 12 is constituted by a diode string similarly to the surge transfer circuit 310, the number of stages of the diodes of the surge transfer circuit 310 is set smaller than that of diodes. The diode string constituting the surge transfer circuit 310 can thereby satisfy the Condition 1.

Furthermore, similarly to the single diode shown in FIG. 12A, this diode string separates the first external power-supply-input terminal 15 from the third external power-supply-input terminal 250 in the normal operation. However, if the CDM surge is applied to the third external power-supply-input terminal 250, the surge transfer circuit 310 applies the surge current to the first external power-supply-input terminal 15. The diode string constituting the surge transfer circuit 310 can, therefore, satisfy the Condition 2.

Figure 12C:
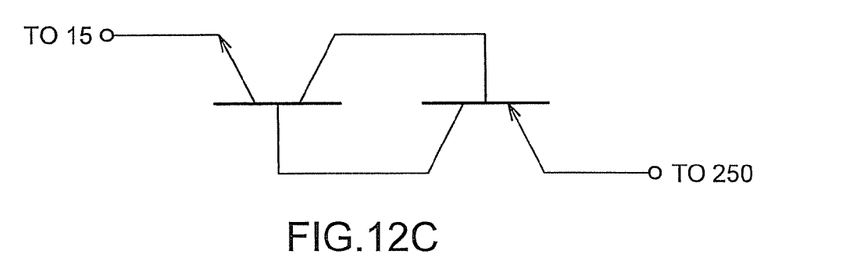

As shown in FIG. 12C, the surge transfer circuit 310 can be constituted by a thyristor. A distance between an anode and a cathode of the thyristor is adjusted, whereby the response speed of the surge transfer circuit 310 can be set equal to or lower than that of the first ESD protection circuit 12. For example, if the first ESD protection circuit 12 is constituted by a thyristor similarly to the surge transfer circuit 310, the distance between the anode and the cathode of the thyristor needs to be set smaller than that of the second ESD protection circuit 13 or the third ESD protection circuit 230 so as to satisfy the Condition 1. Further, if the thyristor is employed, it is necessary to accelerate a response speed of a trigger element accompanying the thyristor.

Furthermore, in the normal operation, the thyristor separates the first external power-supply-input terminal 15 from the third external power-supply-input terminal 250. If the CDM surge is applied to the third external power-supply-input terminal 250, the thyristor applies the surge current to the first external power-supply-input terminal 15. Therefore, the thyristor constituting the surge transfer circuit 310 can satisfy the Condition 2.

Figure 12D:
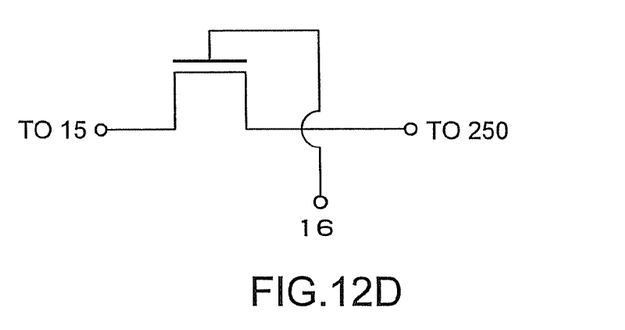
Figure 12E:
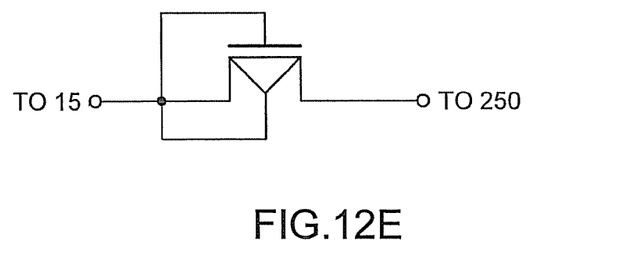

As shown in FIG. 12D or 12E, the surge transfer circuit 310 can be constituted by an NMOS transistor or a PMOS transistor. If the surge transfer circuit 310 is the NMOS transistor, a gate of the NMOS transistor is connected to the second external power-supply-input terminal 16. If a source of the NMOS transistor as well as the gate thereof is connected to the second external power-supply-input terminal 16, the surge transfer circuit 310 is a GGNMOS (Gate Grounded NMOS).

If the surge transfer circuit 310 is the PMOS transistor, a gate of the PMOS transistor as well a source thereof is connected to the first external power-supply-input terminal 15. By adjusting a channel length of the NMOS or PMOS transistor, the response speed of the surge transfer circuit 310 can be set equal to or lower than that of the first ESD protection circuit 12. For example, if the first ESD protection circuit 12 is constituted by an NMOS transistor or a PMOS transistor similarly to the surge transfer circuit 310, the channel length of the NMOS or PMOS transistor constituting the surge transfer circuit 310 is smaller than that of the first ESD protection circuit 12. Therefore, the NMOS or PMOS transistor can satisfy the Condition 1.

Furthermore, in the normal operation, the NMOS or PMOS transistor separates the first external power-supply-input terminal 15 from the third external power-supply-input terminal 250. If the CDM surge is applied to the third external power-supply-input terminal 250, the NMOS or PMOS transistor applies the surge current to the first external power-supply-input terminal 15. Therefore, the NMOS or PMOS transistor can satisfy the Condition 2.

While FIG. 11 shows only the two power supply potentials VDD1 and VDD2, the number of power supply potentials can be set to be three ore more (VDDn, where n is an integer equal to or greater than 3). In this case, the first ESD protection circuit 12 that can deal with the CDM surge is connected to an external power-supply-input terminal corresponding to a power supply having a highest potential among the power supply potentials VDDn.

Moreover, the surge transfer circuits 310 are provided between the power supply potential VDD(i−1) and VDDi (3≦i≦n), respectively. The cathode of each surge transfer circuit 310 is connected to the input terminal having the higher power supply potential and the anode thereof is connected to the input terminal having the lower power supply potential. By doing so, in the normal operation, a forward bias is not applied to the surge transfer circuit 310. The surge transfer circuits 310 can, therefore, satisfy the Condition 2.

A plurality of surge transfer circuits 310 can be configured as shown in any one of FIGS. 12A to 12E. The surge transfer circuits 310 can be configured identically or differently.

In the fourth embodiment, if the CDM surge is input to any one of the external power-supply-input terminals, the surge current is transferred to the first ESD protection circuit 12 via one or a plurality of surge transfer circuits 310 and applied to the second potential VSS via the first ESD protection circuit 12. A plurality of internal circuits connected to the respective power supplies is thereby protected from the CDM surge.

In the fourth embodiment even if a plurality of separate power supplies is provided, there is no need to provide the first ESD protection circuit 12 that can deal with the CDM for every power supply but it suffices to provide one first ESD protection circuit 12 to be common to a plurality of external power-supply-input terminals.

The surge transfer circuit 310 is smaller in installation area than the first ESD protection circuit 12. For example, the surge transfer circuit 310 can be constituted by a single diode. The first ESD protection circuit 12 needs to be constituted by a diode string including at least a plurality of diodes. Even if each of the surge transfer circuit 310 and the first ESD protection circuit 12 is constituted by the diode string, the number of stages of diodes of the surge transfer circuit 310 is smaller than that of the first ESD protection circuit 12. Even if each of the surge transfer circuit 310 and the first ESD protection circuit 12 is constituted by the thyristor, the distance between the anode and the cathode of the surge transfer circuit 310 is smaller than that of the first ESD protection circuit 12. Even if each of the surge transfer circuit 310 and the first ESD protection circuit 12 is constituted by the NMOS or PMOS transistor, the gate length of the surge transfer circuit 310 is smaller than that of the first ESD protection circuit 12.

Even if the surge transfer circuit 310 and the first ESD protection circuits are different types of ESD protection circuits, the surge transfer circuit 310 is smaller in installation area than the first ESD protection circuit 12.

As described in the fourth embodiment, one first ESD protection circuit 12 is provided to be common to a plurality of external power-supply-input terminals, thereby making it possible to reduce a chip size of the entire semiconductor device 20. Besides, the fourth embodiment can also exhibit the advantages of one of the first to third embodiments.

Fifth Embodiment

A semiconductor device according to a fifth embodiment of the present invention can be similar in configuration to the semiconductor device 20 according to the fourth embodiment. Therefore, the fifth embodiment will be described with reference to FIG. 11.

In the fifth embodiment, the potential VDD1 of the first external power-supply-input terminal 15 to correspond to which the first ESD protection circuit 12 is provided is equal to or lower than the potential VDD2 of the third external power-supply-input terminal 250 to correspond to which the ESD protection circuit that can deal with the CDM surge is not provided in the ordinary operation and in a standby state.

In the standby state, for example, the third external power-supply-input terminal 250 is disconnected from the potential VDD2 whereas the first external power-supply-input terminal 15 is kept connected to the potential VDD1. That is, to save power consumption, the third external power-supply-input terminal 250 is disconnected from the potential VDD2 in the standby state while the first external power-supply-input terminal 15 is always kept in a power ON state.

By doing so, the surge transfer circuit 310 does not operate even in the standby state unless the ESD surge occurs. Therefore, the semiconductor device according to the fifth embodiment can suppress power consumption by partially disconnecting the power supplies from the power supply input terminals in the standby state and can protect the internal circuits if the ESD surge occurs.

If the number of power supply voltages is three or more, the semiconductor device according to the fifth embodiment can be configured similarly to that according to the fourth embodiment. In the fifth embodiment, only the highest power supply voltage among the power supply voltages VDDn is always kept in a power ON state. By so setting, if the ESD surge as fast as the CDM is applied to any one of the external power-supply-input terminals, it is possible to secure a discharge path for suppressing the voltage overshoot and to suppress power consumption using the technique of partially disconnecting the power supplies.

As the power supply VDD1 connected to the first external power-supply-input terminal 15, a power supply for an I/O (Input/Output) circuit (a power supply for driving a signal input/output circuit) may possibly be used. This is because the power supply for the I/O circuit normally uses a higher voltage than that used in the internal circuit. Moreover, it is normally unclear at what time a signal is input to a signal input terminal. Due to this, the power supply for the I/O circuit is normally and always in a power ON state. This is why the power supply for the I/O circuit is suited as the power supply connected to the first external power-supply-input terminal 15 connected to the first ESD protection circuit 12 that can deal with the CDM surge.

In the fifth embodiment, the power supplies other than that connected to the power supply input terminal corresponding to the ESD protection circuit that can deal with the CDM surge are disconnected from the power supply input terminals in the standby state, respectively. It is thereby possible to suppress the power consumption in the standby state. Besides, the fifth embodiment can also exhibit the advantages of the fourth embodiment.

The invention claimed is:

1. An ESD protection circuit comprising:
 a plurality of logic gates connected between a first power supply input to which a first potential is applied and a second power supply input to which a second potential lower than the first potential is applied, wherein
 in the plurality of logic gates, output terminals of each of the logic gates at a front stage is connected to an input terminal of each of the logic gate at a rear stage in rear of the front stage,
 if a protection potential between the first potential and the second potential is applied to a connection node connecting the output terminal to the input terminal when the plurality of logic gates respond to an ESD surge, a breakthrough current is carried to the plurality of logic gates from the first potential toward the second potential, and
 if the first potential and the second potential are applied to the first power supply input and the second power supply input, respectively, logic values of the plurality of logic gates are kept in a constant state.

2. The ESD protection circuit according to claim 1, wherein
 the output terminal of each of the logic gates at the front stage is connected to the input terminal of each of the logic gates at the rear stage, whereby the plurality of logic gates is connected in a ring-shaped fashion or a line-shaped fashion.

3. The ESD protection circuit according to claim 1, wherein
 the plurality of logic gates includes one or a plurality of inverters,
 the inverter or one of the inverters includes a P-type transistor and an N-type transistor connected in series between the first power supply input and the second power supply input,
 a gate of the P-type transistor and a gate of the N-type transistor are connected to the input terminal in common,
 one end of the P-type transistor and one end of the N-type transistor are connected to the output terminal in common,
 other end of the P-type transistor is connected to the first external power supply input,
 other end of the N-type transistor is connected to the second external power supply input, and
 when the inverter or the plurality of inverters responds to the ESD surge, the protection potential is a potential between a potential higher than the second potential by a threshold voltage of the N-type transistor and a potential lower than the first potential by a threshold voltage of the P-type transistor.

4. The ESD protection circuit according to claim 2, wherein
 the plurality of logic gates includes one or a plurality of inverters,
 the inverter or one of the inverters includes a P-type transistor and an N-type transistor connected in series between the first power supply input and the second power supply input,
 a gate of the P-type transistor and a gate of the N-type transistor are connected to the input terminal in common,
 one end of the P-type transistor and one end of the N-type transistor are connected to the output terminal in common,
 other end of the P-type transistor is connected to the first external power supply input,
 other end of the N-type transistor is connected to the second external power supply input, and
 when the inverter or the plurality of inverters responds to the ESD surge, the protection potential is a potential between a potential higher than the second potential by a threshold voltage of the N-type transistor and a potential lower than the first potential by a threshold voltage of the P-type transistor.

5. The ESD protection circuit according to claim 1, wherein
 the number of the stages of the logic gates is not less than 4.

6. The ESD protection circuit according to claim 2, wherein
 the number of the stages of the logic gates is not less than 4.

7. The ESD protection circuit according to claim 1, further comprising:
 a surge transfer part connected between a third power supply input and the first power supply input, a third potential higher than the second potential and lower than the first potential being applied to the third power supply input, wherein
 when the ESD surge is input to the third power supply input, the surge transfer part transfers a surge current from the third power supply input to the first power supply input, and
 the plurality of logic gates is provided to be common to the first power supply input and the third power supply input.

8. The ESD protection circuit according to claim 7, wherein
 the surge transfer part is one or a plurality of diodes connected between the first power supply input and the third power supply input.

9. The ESD protection circuit according to claim 7, wherein
 the surge transfer part is one or a plurality of thyristors connected between the first power supply input and the third power supply input.

10. The ESD protection circuit according to claim 7, wherein
 the surge transfer part is one or a plurality of N-type transistors connected between the first power supply input and the third power supply input, and gates of the N-type transistors are connected to the second power supply input.

11. The ESD protection circuit according to claim 7, wherein
 the surge transfer part is one or a plurality of P-type transistors connected between the first power supply input and the third power supply input, and gates of the P-type transistors are connected to the third power supply input.

12. The ESD protection circuit according to claim 7, further comprising:
   a first ESD protector and a second ESD protector connected between the first power supply input and the second power supply input; and
   a third ESD protector connected between the third power supply input and the second power supply input, wherein
   the first ESD protector is operates at a higher speed than speeds of the second ESD protector and the third ESD protector, and
   the surge transfer part operates at a higher speed than the speed of the first ESD protector.

13. The ESD protection circuit according to claim 12, wherein
   the surge transfer part is one or a plurality of diodes connected between the first power supply input and the third power supply input,
   each of the first ESD protector and the second ESD protector includes a plurality of diodes, and
   number of diodes included in the surge transfer part is smaller than the number of the diodes included in the second ESD protector and the number of diodes included in the third ESD protector.

14. The ESD protection circuit according to claim 7, wherein
   the third potential is not higher than the first potential.

15. The ESD protection circuit according to claim 14, wherein
   the first potential is always in a power ON state.

16. The ESD protection circuit according to claim 14, wherein
   the first potential is a power supply potential for an I/O circuit.

* * * * *